United States Patent
Sperling et al.

(10) Patent No.: US 7,212,062 B2
(45) Date of Patent: May 1, 2007

(54) POWER SUPPLY NOISE INSENSITIVE MULTIPLEXER

(75) Inventors: Michael A. Sperling, Poughkeepsie, NY (US); Seongwon Kim, Old Tappan, NJ (US); Paul D. Muench, Poughkeepsie, NY (US); Hector Saenz, Round Rock, TX (US)

(73) Assignee: International Business Machines Corporation, Armonk, NY (US)

( * ) Notice: Subject to any disclaimer, the term of this patent is extended or adjusted under 35 U.S.C. 154(b) by 164 days.

(21) Appl. No.: 11/054,831

(22) Filed: Feb. 10, 2005

(65) Prior Publication Data

US 2006/0176080 A1    Aug. 10, 2006

(51) Int. Cl.
*H03K 17/00* (2006.01)

(52) U.S. Cl. ............... 327/410; 326/105; 326/113; 327/409

(58) Field of Classification Search ................ 326/105, 326/113; 327/407–411
See application file for complete search history.

(56) References Cited

U.S. PATENT DOCUMENTS

| | | | |
|---|---|---|---|
| 5,180,932 A | 1/1993 | Bengel ................. 307/353 |
| 5,598,114 A | 1/1997 | Jamshidi ............... 326/113 |
| 5,625,303 A | 4/1997 | Jamshidi ............... 326/106 |
| 5,646,558 A | 7/1997 | Jamshidi ............... 326/106 |
| 5,701,095 A * | 12/1997 | Ohsawa ................. 327/410 |
| 5,773,995 A | 6/1998 | Crocker ................. 326/108 |
| 6,462,582 B1 * | 10/2002 | Forbes .................... 326/98 |
| 6,646,464 B2 * | 11/2003 | Maruyama ............... 326/35 |
| 6,882,211 B2 * | 4/2005 | Kozaki .................. 327/407 |
| 2002/0175740 A1 | 11/2002 | Ruegg et al. ............ 327/408 |
| 2004/0008073 A1 | 1/2004 | Kozaki .................. 327/415 |
| 2004/0178452 A1 * | 9/2004 | Miyasaka ............... 257/350 |

* cited by examiner

*Primary Examiner*—Rexford Barnie
*Assistant Examiner*—Jason Crawford
(74) *Attorney, Agent, or Firm*—Lynn L. Augspurger

(57) ABSTRACT

CMOS circuitry used to multiplex between data inputs suffers from high sensitivity to power supply noise, resulting in delay variations. By utilizing current controlled inverters in a multiplexer structure, power supply insensitivity can be achieved with either of two multiplexing methods. The first method places switches on the data inputs while the second places the switches on the analog bias voltages inherent to a current controlled inverter.

6 Claims, 3 Drawing Sheets

POWER SUPPLY NOISE INSENSITIVE MULTIPLEXER

CROSS-REFERENCE TO RELATED APPLICATIONS

This application contains subject matter which is related to the subject matter of the following co-pending applications, each of which is assigned to the same assignee as this application, International Business Machines Corporation of Armonk, N.Y. Each of the below listed applications is hereby incorporated herein by reference in its entirety:

"Power Supply Insensitive Delay Element", Dreps et al, U.S. Ser. No. 11/056,798, filed concurrently herewith.

"On-Chip Detection of Power Supply Vulnerabilities", Sperling et al, U.S. Ser. No. 11/056,822, filed concurrently herewith.

TRADEMARKS

IBM ® is a registered trademark of International Business Machines Corporation, Armonk, N.Y., U.S.A. and other names used herein may be registered trademarks, trademarks or product names of International Business Machines Corporation or other companies.

BACKGROUND OF THE INVENTION

1. Field of the Invention

This invention relates to digital multiplexer circuits and particularly to noise insensitive multiplexer designs.

2. Description of Background

Before our invention there were many means by which the multiplexing of signals could occur. U.S. Pat. Nos. 5,598,115; 5,625,303; 5,646,558; 5,773,995 and patent application 2004/0008073 all show circuits in which transistor passgates are used to drive a common node. These designs suffer from high sensitivity to power supply noise perturbations, as the delay from input to output is directly proportional to the power supply value.

SUMMARY OF THE INVENTION

The shortcomings of the prior art are overcome and additional advantages are provided through the provision of a current controlled inverter structure incorporated into the basic multiplexer. The method of switching between the inputs is accomplished by creating high impedance nodes on the unselected paths. Two methods of creating this high impedance are detailed herein.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

The detailed description explains the preferred embodiments of the invention, together with advantages and features, by way of example with reference to the drawings.

DETAILED DESCRIPTION OF THE INVENTION

Figure 1:
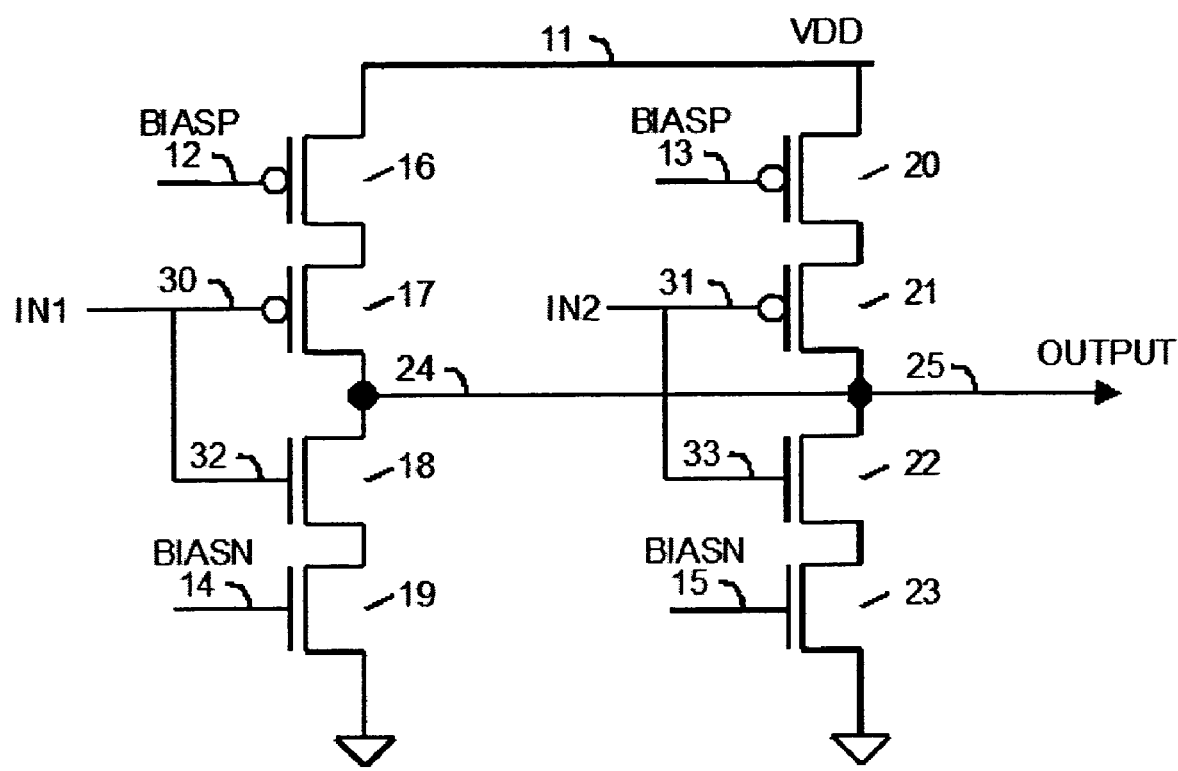
FIG. 1 illustrates one example of two current controlled inverters connected at their output.

Referring now to FIG. 1 of the drawings, a pair of current controlled inverters connected at their outputs is formed. The transistors 17 and 18 are connected as a simple inverter where nodes 30 and 32 are shorted to the primary data input IN1. The transistors 16 and 19 are connected as bias transistors where node 12 is the analog input BIASP and node 14 is the analog input BIASN. A second current controlled inverter formed by transistors 20, 21, 22 and 23 is connected in the same manner. Nodes 31 and 33 are shorted to the primary data input IN2, node 13 is connected to the analog input BIASP and node 15 is connected to the analog input BIASN. The output of the first inverter, denoted by node 24, is shorted to the output of the second inverter, denoted by node 25, and encompasses the primary output. Further details of the current controlled inverter and the generation of analog voltages BIASN and BIASP can be found in "Power Supply Insensitive Delay Element", Dreps et al referenced above.

The circuit detailed in FIG. 1 will not multiplex between the two data inputs and will introduce significant distortion on the output. In order to select just one input, a high impedance must be created at the drains of the unselected transistors. To select IN1 the high impedance must be created on the drains of transistors 21 and 22. To select IN2 the high impedance must be created on the drains of transistors 17 and 18. One method is to short the unselected data input to a power supply, while another method is to short the analog bias voltage inherent to a current controlled inverter to a power supply. Both of these methods may be expanded for any number of inputs signals.

Figure 2:
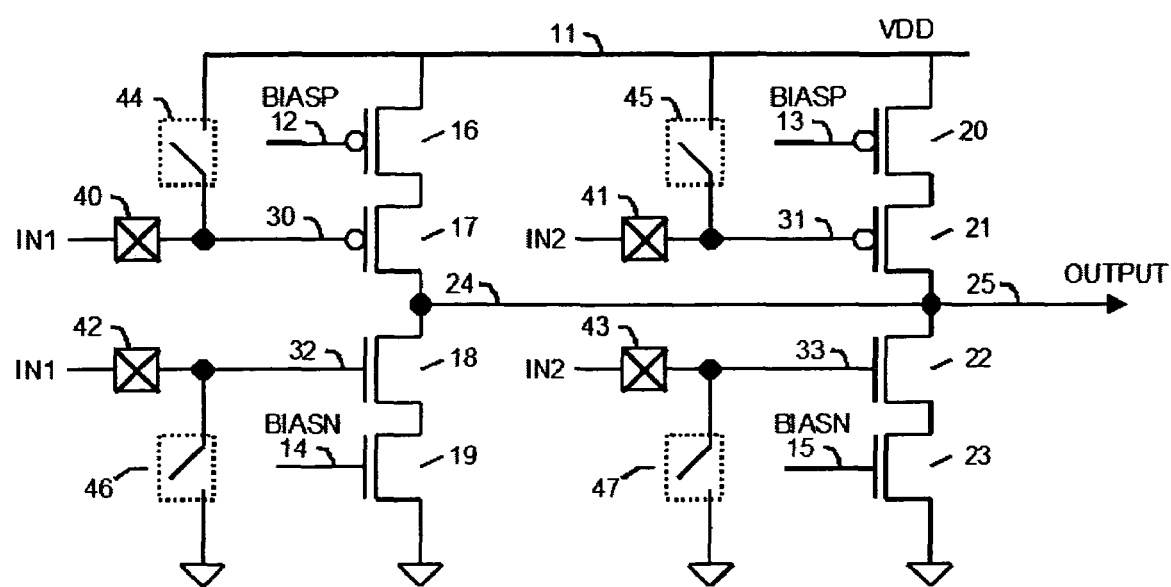
FIG. 2 illustrates one example of creating a high impedance node using passgates on the data inputs.

Referring now to FIG. 2 of the drawings, the current controlled inverters from FIG. 1 are connected such that the inputs may be multiplexed to the output. Passgates 40, 41, 42, and 43 are connected between their respective data inputs and transistor gate nodes 30, 31, 32, 33. Switches 44, 45, 46 and 47 are connected such that they may short their respective transistor gate nodes to whichever voltage that turns off the transistor. For the p-type transistors this is the VDD power supply shown as node 11. For the n-type transistors this is the ground node. When selecting the IN1 data input, passgates 40 and 42 will pass the IN1 input signal to nodes 30 and 32 respectively, while passgates 41 and 43 will block the IN2 input signal from being passed to nodes 31 and 33 respectively. At the same time, switches 44 and 46 will remain open to allow the IN1 input signal to propagate through and switches 45 and 47 will short the respective power supplies to nodes 31 and 33. By shorting node 31 to the power supply 11 and shorting node 33 to ground a high impedance is created at the drains of transistors 21 and 22. This allows the signal from IN1 to propagate to the output without distortion. This operation can be reversed to select the IN2 input signal instead of IN1. It may also be expanded to include any number of other data input signals.

Figure 3:
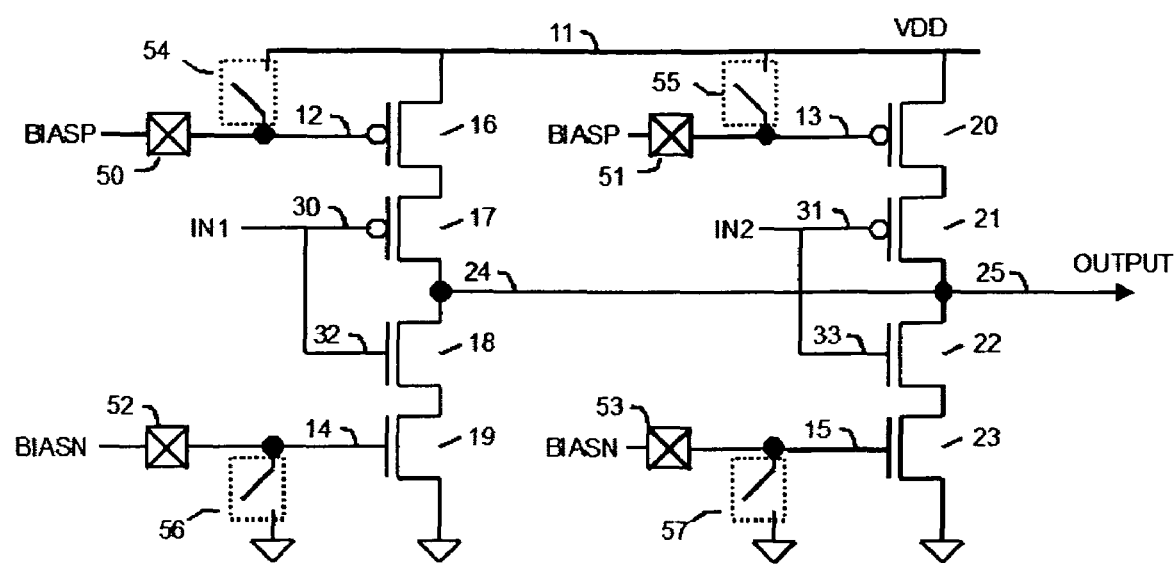
FIG. 3 illustrates one example of creating a high impedance node using passgates on the analog bias inputs.

Referring now to FIG. 3 of the drawings, the current controlled inverters from FIG. 1 are connected in another manner such that the inputs may be multiplexed to the output. Passgates 50, 51, 52, and 53 are connected between their respective analog bias voltage inputs and transistor gate nodes 12, 13, 14, 15. Switches 54, 55, 56 and 57 are connected such that they may short their respective transistor gate nodes to whichever voltage that turns off the transistor. For the p-type transistors this is the VDD power supply shown as node 11. For the n-type transistors this is the ground node. When selecting the IN1 data input, passgate 50 will pass the BIASP analog input signal to node 12 and passgate 52 will pass the BIASN analog input signal to node 14. Passgates 41 and 43 will block their respective analog bias input signal from being passed to nodes 13 and 15 respectively. At the same time, switches 54 and 56 will remain open to allow the analog bias input signals to pass through and switches 55 and 57 will short the respective power supplies to nodes 13 and 15. By shorting node 13 to the power supply 11 and shorting node 15 to ground a high impedance is created at the drains of transistors 20 and 23. Since transistors 20 and 21 as well as transistors 22 and 23 are in series the high impedance is also seen at the drains of transistors 22 and 23. This allows the signal from IN1 to propagate to the output without distortion. This operation can be reversed to select the IN2 input signal instead of IN1. It may also be expanded to include any number of other data input signals.

Referring now to FIGS. 2 and 3, commonality features between the two designs are evident by the use of identical passgates 40, 41, 42, 43 and 50, 51, 52, 53. Switches 44, 45, 46, 47 and 54, 55, 56, 57 are also common between the two designs. The multiplexing method may therefore be selected by moving the switching design elements.

The capabilities of the present invention can be implemented in hardware. The circuit provided by the hardware can be provided by a design service of IBM and others to enable creation and use of the circuit provided by the hardware.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A method for creating a low noise multiplexing circuit, comprising the steps of:

Providing a first and a second current controlled inverter, and coupling the output of said first current controlled inverter to the output of said second current controlled inverter to enable combining said first and second current controlled inverters as two combined current controlled inverters, said first and said second current controlled inverters each have data inputs and said first and second current controlled inverters are each provided with switching elements on their data inputs enabling multiplexing between the data inputs of the first and second current controlled inverters, wherein each of said current controlled inverters includes an analog bias input in addition to said data input and on each analog bias input a corresponding switch is placed to enable multiplexing between the analog bias inputs.

2. The method according to claim 1 wherein said switching elements include pass gates.

3. A service for enabling an inverter to have improved noise insensitivity, comprising: providing a first and a second current controlled inverter, and coupling the output of said first current controlled inverter to the output of said second current controlled inverter to enable combining said first and second current controlled inverters as two combined two current controlled inverters, said first and said second current controlled inverters each have data inputs and said first and second current controlled inverter are each provided with switching elements on their data inputs enabling multiplexing between the data inputs of the first and second current controlled inverters, wherein each of said current controlled inverters includes an analog bias input in addition to said data input and on each analog bias input a corresponding switch is placed to enable multiplexing between the analog bias inputs.

4. The service according to claim 3 wherein said switching elements include pass gates.

5. A circuit with improved noise insensitivity, comprsing: a pair of current controlled inverters connected at their outputs having each a pair of transistors coupled as a simple inverters with current nodes shorted to a primary data input and also having a pair of transistors connected as bias transistors each with an analog bias input and wherein the output of the first inverter is shorted to the output of the second inverter to provide a primary output wherein as the inputs may be multiplexed to the output, and the output and switching elements are connected between their respective data inputs and transistor gate nodes and switching elements are connected such that they may short their respective transistor gate nodes to whichever voltage that turns off a transistor.

6. A circuit with improved noise insensitivity, comprising: a pair of current controlled inverters connected at their outputs having each a pair of transistors coupled as a simple inverters with current nodes shorten to a primary data input and also having a pair of transistors connected as bias transistors each with an analog bias input and wherein the output of the first inverter is shorted to output of the second inverter to provide a primary output, wherein the current controlled inverters are connected in another manner such that the inputs may be multiplexed to the output, and wherein pass gates are connected between their respective analog bias voltage inputs and transistor gate nodes and additional switching elements for each of said inputs are connected such that they may short their respective transistor gate nodes to whichever voltage that turns off the transistor, and wherein said transistors in each inverter are in series, allowing pass gates to block their respective analog bias input signal from being passed while switches remain open to allow analog bias input signals to pass through while other switches will short the respective power supplies to a shorting node to the power supply and another node to ground wherein a high impedance is created at the drains of input transistors in an inverter which input transistors are in series with other transistors of said inverters such that high impedance is also seen at the drains of said other transistors to allow an input signal from a first inverter to propagate to the output without distortion and wherein the operation can be reversed to select the second inverter input signal instead of the first inverter input signal.

* * * * *